(12) United States Patent
Yang et al.

(10) Patent No.: US 12,200,956 B2
(45) Date of Patent: Jan. 14, 2025

(54) ELECTROLUMINESCENT DISPLAY DEVICE

(71) Applicant: LG Display Co., Ltd., Seoul (KR)

(72) Inventors: Suk Yang, Seoul (KR); Jeongha Shin, Seoul (KR); JooHwan Shin, Goyang-si (KR); HeeSuk Pang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 325 days.

(21) Appl. No.: 17/517,604

(22) Filed: Nov. 2, 2021

(65) Prior Publication Data

US 2022/0149320 A1 May 12, 2022

(30) Foreign Application Priority Data

Nov. 6, 2020 (KR) .................. 10-2020-0147366

(51) Int. Cl.
| | |
|---|---|
| *H10K 50/842* | (2023.01) |
| *H10K 50/11* | (2023.01) |
| *H10K 50/822* | (2023.01) |
| *H10K 50/844* | (2023.01) |
| *H10K 59/122* | (2023.01) |
| *H10K 59/124* | (2023.01) |
| *H10K 71/00* | (2023.01) |
| *H10K 59/12* | (2023.01) |

(52) U.S. Cl.
CPC ......... *H10K 50/8426* (2023.02); *H10K 50/11* (2023.02); *H10K 50/822* (2023.02); *H10K 50/844* (2023.02); *H10K 59/122* (2023.02); *H10K 59/124* (2023.02); *H10K 71/00* (2023.02); *H10K 59/1201* (2023.02)

(58) Field of Classification Search
None
See application file for complete search history.

(56) References Cited

U.S. PATENT DOCUMENTS

| | | | |
|---|---|---|---|
| 10,529,949 B2 | 1/2020 | Song et al. | |
| 10,714,707 B2 * | 7/2020 | Kim ............... | H10K 77/10 |
| 11,049,913 B2 | 6/2021 | Choi et al. | |
| 11,424,305 B2 | 8/2022 | Lee et al. | |
| 11,462,714 B2 | 10/2022 | Yun et al. | |
| 2015/0207100 A1 | 7/2015 | Saito et al. | |
| 2016/0202534 A1 * | 7/2016 | Chen ............... | G02F 1/1339 |
| | | | 349/43 |
| 2017/0288004 A1 * | 10/2017 | Kim ............... | H10K 77/10 |

(Continued)

FOREIGN PATENT DOCUMENTS

| | | |
|---|---|---|
| KR | 10-2017-0096646 A | 8/2017 |
| KR | 10-2018-0047295 A | 5/2018 |

(Continued)

*Primary Examiner* — Michelle Mandala
(74) *Attorney, Agent, or Firm* — Seed IP Law Group LLP

(57) ABSTRACT

An electroluminescent display device includes a display panel having a display area and a non-display area. A planarization layer is over the non-display area. A bank is on the planarization layer. An organic layer and a cathode are on the bank. A trench pattern extends through the cathode and the organic layer. An adhesive layer and an encapsulation substrate are disposed over the cathode. The adhesive layer covers the trench pattern. The adhesive layer is effective to slow a rate of moisture penetration to a side surface of the non-display area, allowing for improvements in reliability and a reduction in bezel width.

19 Claims, 15 Drawing Sheets

(56) References Cited

U.S. PATENT DOCUMENTS

| | | |
|---|---|---|
| 2019/0074481 A1 | 3/2019 | Kim et al. |
| 2019/0245015 A1* | 8/2019 | Lee .................... H10K 59/122 |
| 2020/0136068 A1 | 4/2020 | Lee et al. |
| 2020/0212140 A1 | 7/2020 | Huh |

FOREIGN PATENT DOCUMENTS

| | | |
|---|---|---|
| KR | 10-2018-0065362 A | 6/2018 |
| KR | 20190096467 A | 8/2019 |
| KR | 10-2020-0037908 A | 4/2020 |
| KR | 20200044442 A | 4/2020 |
| KR | 10-2020-0049115 A | 5/2020 |
| KR | 20200068952 A | 6/2020 |

\* cited by examiner

ELECTROLUMINESCENT DISPLAY DEVICE

CROSS-REFERENCE TO RELATED APPLICATIONS

This application claims the benefit of and priority to Korean Patent Application No. 10-2020-0147366 filed on Nov. 6, 2020 in the Republic of Korea, the entire contents of which are hereby expressly incorporated by reference into the present application.

BACKGROUND

Technical Field

The present disclosure relates to an electroluminescent display device, and more particularly, to an electroluminescent display device having a narrow bezel.

Description of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly.

Representative display devices include a liquid crystal display device (LCD), an electro-wetting display device (EWD), an organic light emitting display device (OLED), and the like.

Among these various display devices, an electroluminescent display device including an organic light emitting display device is a self-light emitting display device, and can be manufactured to be light and thin since it does not require a separate light source, unlike a liquid crystal display device having a separate light source. In addition, the electroluminescent display device has advantages in terms of power consumption due to a low voltage driving, and is excellent in terms of a color implementation, a response speed, a viewing angle, and a contrast ratio (CR). Therefore, electroluminescent display devices are expected to be utilized in various fields.

The electroluminescent display device is constructed by disposing a light emitting layer using an organic material between two electrodes that are referred to as an anode and a cathode. Then, when holes from the anode are injected into the light emitting layer and electrons from the cathode are injected into the light emitting layer, the injected electrons and holes recombine with each other to form excitons in the light emitting layer and emit light.

The light emitting layer contains a host material and a dopant material, so that the two materials interact. A host generates excitons from electrons and holes and serves to transfer energy to a dopant, and the dopant is a dye-based organic material added in a small amount, and serves to receive energy from the host and convert it into light.

BRIEF SUMMARY

In current electroluminescent display devices, reduced bezel distance is beneficial to reliability, such as by preventing moisture penetration. A "reliable bezel" may be a bezel distance sufficiently small to achieve a beneficial level of moisture penetration prevention. The reliable bezel may be a distance from an end of an upper substrate (e.g., an encapsulation substrate) to an end of a cathode.

In response to demand for slimming of display devices, demand for slimming of a non-display area of the display device, generally peripheral to a display area on which an image is displayed, is also increasing. When the cathode and an organic layer are deposited, a shadow area is generated due to a gap between a mask and a substrate. The shadow area may increase difficulty in reducing bezel dimensions. Position and length of the shadow area are non-uniform due to process variation, and quality uniformity may be degraded due to differences in reliable bezel distance by each product.

Accordingly, a technical feature of the present disclosure provides an electroluminescent display device capable of reducing bezel width by converting an existing shadow area into reliable bezel area.

Technical features of the present disclosure are not limited to the above-mentioned technical feature, and other technical features, which are not mentioned above, can be clearly understood by those skilled in the art from the following description.

An electroluminescent display device according to an embodiment of the present disclosure may include a display panel which is divided into a display area and a non-display area, a planarization layer and a bank which extend to a non-display area of the display panel, an organic layer and a cathode which are disposed on the bank and extend to the non-display area of the display panel, a trench pattern which is disposed in the non-display area outside the display area and in which the cathode and the organic layer are removed and an adhesive layer and an encapsulation substrate which are disposed over the cathode, wherein the adhesive layer covers the trench pattern.

An electroluminescent display device according to another embodiment of the present disclosure may include a substrate which is divided into a display area and a non-display area, a planarization layer which is disposed on the substrate, a bank which is disposed over the planarization layer, an organic layer, a cathode, and a capping layer which are disposed on the bank and extend to the non-display area of the substrate, at least one trench pattern which is disposed in the non-display area outside the display area and in which the capping layer, the cathode, the organic layer, the bank and the planarization layer are removed, a passivation layer which is disposed on a bottom inside the trench pattern, an adhesive layer which fills an inside of the trench pattern and is disposed over the substrate and an encapsulation substrate which is disposed on the adhesive layer.

Other detailed matters of the embodiments are included in the detailed description and the drawings.

In the present disclosure, a portion of the cathode and the organic layer is removed by forming the trench pattern in an unnecessary shadow area that is generated due to the use of a deposition mask, so that it is possible to delay a rate of moisture penetration to a side surface of the non-display area, thereby allowing for improvements in reliability and a reduction in bezel width.

The effects according to the present disclosure are not limited to the contents exemplified above, and more various effects are included in the present specification.

DETAILED DESCRIPTION

Figure 1:
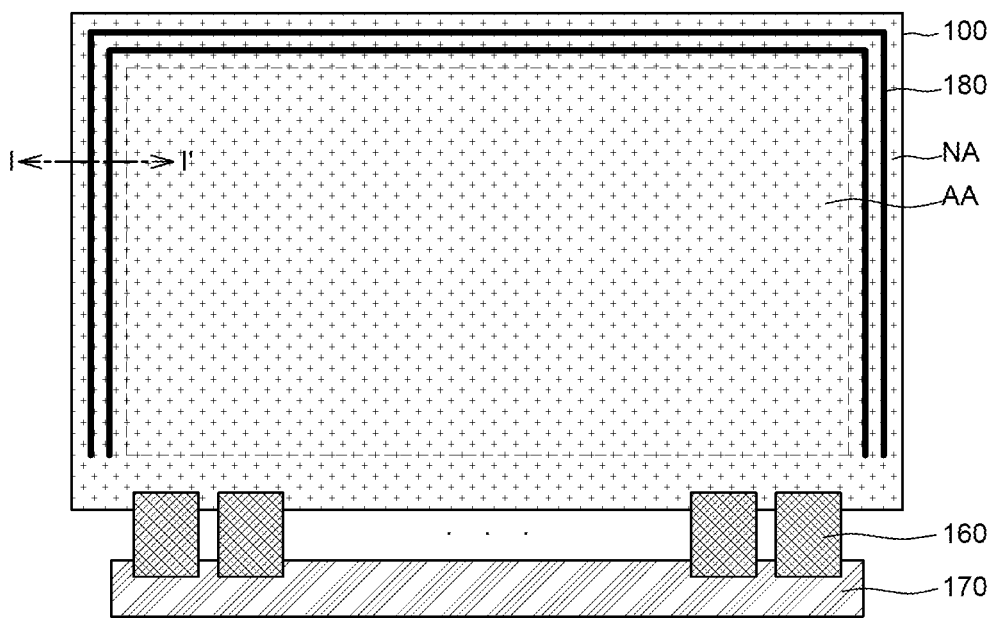
FIG. 1 is a plan view of an electroluminescent display device according to a first embodiment of the present disclosure.

Advantages and characteristics of the present disclosure and a method of achieving the advantages and characteristics will be clear by referring to embodiments described below in detail together with the accompanying drawings. The present disclosure is not limited to the embodiments disclosed herein but may be implemented in various forms. The embodiments are provided by way of example, so that those skilled in the art can better understand the technical features and benefits of the present disclosure Shapes, sizes, ratios, angles, numbers, and the like illustrated in the accompanying drawings for describing the embodiments of the present disclosure are examples, and the embodiments are not limited thereto. Such shapes, sizes, ratios, angles, numbers and the like should be understood to include appropriate ranges that will be easily discerned by those skilled in the art. Like reference numerals generally denote like elements throughout the specification. In the following description of the present disclosure, a detailed explanation of known related technologies may be omitted to avoid distracting from the technical features and benefits described with reference to embodiments of the present disclosure. The terms such as "including," "having," and "consist of" used herein are generally intended to be open, allowing for other components to be added unless the terms are used with the term "only." Any references in the singular may include the plural unless expressly stated otherwise.

Components and dimensions thereof include a range of tolerance, error, variation or the like, even where not expressly stated.

When a position relationship between two parts is described using terms such as "on," "above," "over," "below," "beneath," "under," and "next," one or more parts may be positioned between the two parts unless the terms are used with the term "immediately" or "directly." The positional terms just listed should include above, beneath, to the right of, to the left of, in front of and behind, which will be understandable based on orientation of a structure including the two parts.

When an element or layer is described as disposed "on" another element or layer, another layer or another element may be interposed directly on the other element or therebetween.

Although the terms "first," "second," and the like are used for describing various components, these components are not confined by these terms, for example, in sequence, priority, physical dimension or otherwise. These terms are merely used for distinguishing one component from other components. Therefore, a first component to be mentioned below may be a second component in a technical concept (e.g., sequence) of the present disclosure.

Size and thickness of each component illustrated in the drawings are illustrated for convenience of description, and such sizes and thicknesses may not be drawn to scale. As such, the size and the thickness of each component illustrated should be accorded a range understood as described in the various embodiments, or as would be discernable by those skilled in the art.

Features, structures or characteristics may be described in the context of a single embodiment or multiple embodiments. In one or more embodiments, features, structure or characteristics may be omitted. Features, structures or characteristics described in the context of one or more embodiments may be combined with each other in any suitable manner, and may be structurally positioned and/or connected and operated in a variety of ways. The various embodiments may be realized independently of, or in association with, each other.

Hereinafter, embodiments of the present disclosure will be described in detail with reference to accompanying drawings.

FIG. 1 is a plan view of an electroluminescent display device according to a first embodiment of the present disclosure.

Referring to FIG. 1, the electroluminescent display device according to the first embodiment of the present disclosure may include a display panel 100, flexible films 160, and a printed circuit board 170.

The display panel 100 is a panel for displaying an image to a user.

In the display panel 100, display elements for displaying an image, a driving element for driving the display elements, and lines for transmitting various signals to the display elements and the driving element may be disposed. The display element may include different materials and/or structure depending on a type of the display panel 100. For example, when the display panel 100 is an organic light emitting display panel, the display element is an organic light emitting element including an anode, an organic light emitting layer, and a cathode. For example, when the display panel 100 is a liquid crystal display panel, the display element may be a liquid crystal display element. Hereinafter, description of the display panel 100 is provided in the context of an organic light emitting display panel, but the display panel 100 is not limited to the organic light emitting display panel.

The display panel 100 may include a display area AA and a non-display area NA.

The display area AA is an area in which an image is displayed on the display panel 100.

A plurality of sub-pixels constituting a plurality of pixels and a circuit for driving the plurality of sub-pixels may be disposed in the display area AA. The plurality of sub-pixels are units constituting the display area AA, and the display element may be disposed in each of the plurality of sub-pixels, and the plurality of sub-pixels may constitute a pixel. For example, an organic light emitting element including an anode, an organic light emitting layer, and a cathode may be disposed in each of the plurality of sub-pixels, but is not limited thereto. In addition, a circuit for driving the plurality of sub-pixels may include a driving element, a wiring, and the like. For example, the circuit may include a thin film transistor, a capacitor, a gate line, a data line, and the like, but is not limited thereto.

The non-display area NA is an area in which an image is not displayed.

FIG. 1 illustrates that the non-display area NA surrounds the display area AA having a rectangular shape, but shapes and arrangements of the display area AA and the non-display area NA are not limited to the example illustrated in FIG. 1.

In other words, the shapes of the display area AA and the non-display area NA may be suitable for a design of an electronic device on which the electroluminescent display device is mounted. For example, a shape of the display area AA may be a pentagon, a hexagon, a circle, an oval, or the like.

Various lines and circuits for driving organic light emitting elements of the display area AA may be disposed in the non-display area NA. For example, in the non-display area NA, link lines for transmitting signals to the plurality of sub-pixels and circuits of the display area AA or driver ICs such as a gate driver IC and a data driver IC may be disposed, but are not limited thereto.

The electroluminescent display device may include various additional elements for generating various signals or driving pixels in the display area AA. The additional elements for driving the pixels may include an inverter circuit, a multiplexer, an electro-static discharge (ESD) circuit, and the like. The electroluminescent display device may also include additional elements associated with functions other than driving pixels. For example, the electroluminescent display device may include additional elements that provide a touch sensing function, a user authentication function (e.g., fingerprint recognition), a multi-level pressure sensing function, a tactile feedback function, and the like. The above-mentioned additional elements may be located in the non-display area NA and/or in an external circuit coupled to a connection interface.

The flexible film 160 is a film in which various components are disposed on a flexible base film. Specifically, the flexible films 160 are films for supplying signals to the plurality of sub-pixels and circuits of the display area AA, and may be electrically coupled to the display panel 100. The flexible films 160 may be disposed at one end of the non-display area NA of the display panel 100 and supply a power voltage, a data voltage and the like to the plurality of sub-pixels and circuits of the display area AA. The number of flexible films 100 may be variously changed according to design, but is not limited to the configuration illustrated in FIG. 1.

Meanwhile, driver ICs such as a gate driver IC and a data driver IC may be disposed on the flexible films 160. The driver IC is a component that processes data for displaying an image and a driving signal for processing it. The driver IC may be disposed in a chip-on-glass (COG), chip-on-film (COF), or tape carrier package (TCP) method according to a mounting method.

The printed circuit board 170 may be disposed at first ends of the flexible films 160 and coupled to the flexible films 160. Opposite ends of the flexible films 160 may be coupled to the display panel 100. The printed circuit board 170 is a component that supplies signals to the driver ICs. The printed circuit board 170 may supply various signals such as a driving signal and a data signal to the driver ICs. For example, a data driver generating data signals may be mounted on the printed circuit board 170, and the generated data signals may be supplied to the plurality of sub-pixels and circuits of the display panel 100 through the flexible films 160. A single printed circuit board 170 is shown in FIG. 1. In one embodiment, two or more printed circuit boards 170 may be coupled to the display panel 100 and/or each other.

In the electroluminescent display device, a reduced bezel distance is beneficial to secure reliability such as moisture penetration prevention, and demand for slimming of the non-display area NA is also increasing in accordance with demand for slimming of display devices. In this case, when a cathode and an organic layer are deposited, a shadow area is generated due to a gap between a mask and a substrate, thereby limiting a reduction in bezel.

Accordingly, the first embodiment of the present disclosure is characterized in that portions of the cathode and the organic layer are removed by forming trench patterns 180 in the shadow area in the non-display area NA, thereby delaying a rate of moisture penetration to a side surface of the non-display area NA. In this manner, a bezel width can be reduced by converting existing shadow area into a reliable bezel area.

The trench patterns 180 according to the first embodiment of the present disclosure may be formed over three surfaces (or "end portions") of the non-display area NA except for a lower end portion of the display panel 100 to which the flexible films 160 are coupled, but is not limited thereto. The trench patterns 180 may not be formed in the lower end portion of the display panel 100 due to a risk of damage by laser due to arrangement of the driver ICs and application of voltage, but the present disclosure is not limited thereto. As illustrated in FIG. 1, the end portions include an upper end portion opposite the lower end portion, and left-side and right-side end portions that extend from the upper end portion to the lower end portion. The trench patterns 180 are over the upper end portion and the left-side and right-side end portions. The lower end portion is substantially free of the trench patterns 180.

The trench patterns 180 may be formed by, for example, removing the cathode and the organic layer of the shadow area outside the display area AA through laser ablation. Accordingly, a reliable bezel area may be expanded, and the bezel width may be reduced by an amount equal to a length of the reliable bezel area that is added.

A planarization layer and a bank area are lower moisture permeable paths. In one embodiment, the trench patterns 180 may be extended into the planarization layer and the bank area through a photolithographic process, but the present disclosure is not limited thereto.

A passivation layer for protecting a gate-in-panel (GIP) circuit from laser ablation may be disposed in the trench patterns 180, but is not limited thereto. Various components that constitute the electroluminescent display device, including the trench patterns 180, are described in detail with reference to FIGS. 2 and 3.

Figure 2:
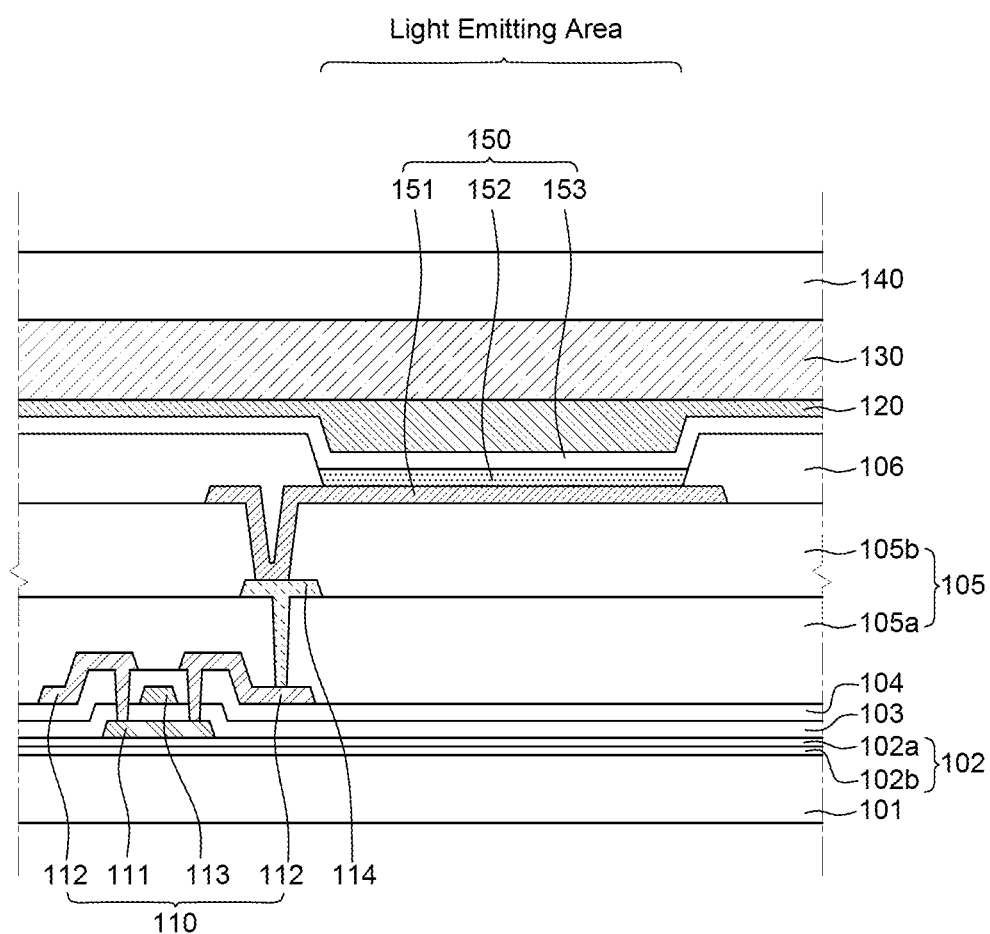
FIG. 2 is a cross-sectional view of a sub-pixel of the electroluminescence display according to the first embodiment of the present disclosure.

FIG. 2 is a cross-sectional view of a sub-pixel of the electroluminescence display according to the first embodiment of the present disclosure.

Figure 3:
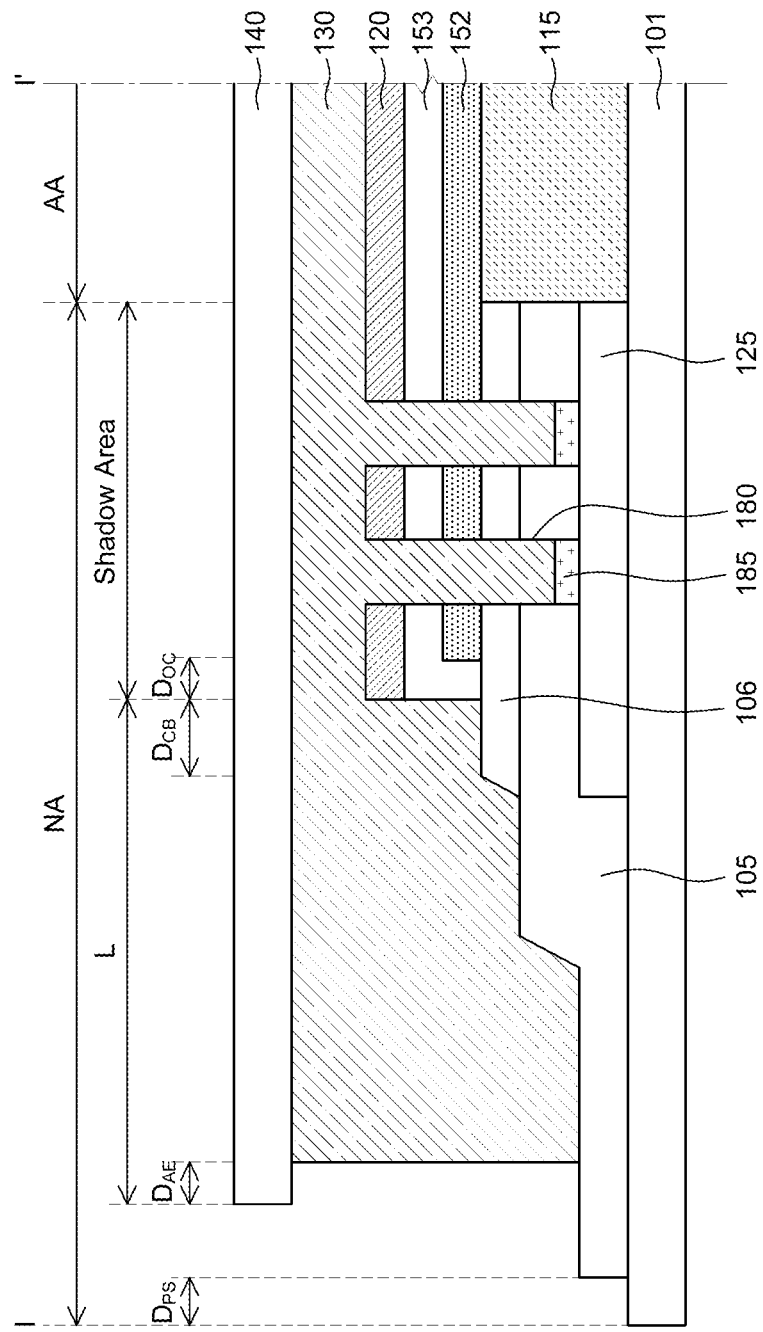
FIG. 3 is a cross-sectional view taken along line I-I' of FIG. 1.

FIG. 3 is a cross-sectional view taken along line I-I' of FIG. 1.

FIG. 3 shows, for example, a cross-section of a portion of a right side of the display panel 100 in which the trench pattern 180 is formed. In FIG. 3, a pixel unit 115 in the display area AA is schematically illustrated for convenience of description. The pixel unit 115 may include various components under an organic layer 152. In addition, a gate-in-panel (GIP) unit 125 in the non-display area NA may also include various components, and is schematically illustrated. The pixel unit 115 may be or include one or more of a pixel structure and pixel circuitry, and may be referred to as a pixel structure 115 or a pixel circuit 115. The GIP unit 125 may be a GIP circuit 125, and may be referred to as a GIP circuit 125.

Referring to FIGS. 2 and 3, in the electroluminescent display device according to the first embodiment of the present disclosure, a driving element 110 may be disposed on a substrate 101.

A planarization layer 105 may be disposed on the driving element 110.

An organic light emitting element 150 that is electrically coupled to the driving element 110 is disposed on the planarization layer 105, and a capping layer 120 may be disposed on the organic light emitting element 150 to thereby minimize or reduce penetration of oxygen and moisture to the organic light emitting element 150.

An adhesive layer 130 and an encapsulation substrate 140 may be sequentially disposed on the capping layer 120. However, the present disclosure is not limited to such a stacked structure.

The substrate 101 may be a glass or plastic substrate. In the case of the plastic substrate, a polyimide-based or polycarbonate-based material may be used to have flexibility. In particular, polyimide is widely used for a plastic substrate because it can be applied to high-temperature processes and can be coated.

A buffer layer 102 may be disposed on the substrate 101.

The buffer layer 102, a functional layer for protecting various electrodes and lines from impurities such as alkali ions leaking from the substrate 101 or underlayers thereof, may have a multilayer structure formed of a first buffer layer 102a and a second buffer layer 102b, but is not limited thereto. The buffer layer 102 may be formed of silicon oxide (SiOx), silicon nitride (SiNx), or a multilayer thereof.

The buffer layer 102 may delay diffusion of permeated moisture and/or oxygen into the substrate 101. Also, the buffer layer 102 may include a multi-buffer and/or an active buffer. The active buffer may protect an active layer 111 composed of a semiconductor of the driving element 110 and block various types of defects introduced from the substrate 101. The active buffer may be formed of, for example, amorphous silicon (a-Si).

The driving element 110 may have a form in which the active layer 111, an insulating layer 103, a gate electrode 113, a gate insulating layer 104, a source electrode and a drain electrode 112 are sequentially disposed, and may be electrically coupled to the organic light emitting element 150 through a connection electrode 114 to thereby transmit a current or a signal to the organic light emitting element 150.

The active layer 111 may be positioned on the buffer layer 102. The active layer 111 may be formed of polysilicon (p-Si), and in this case, a predetermined area or selected area thereof may be doped with impurities. The active layer 111 may be formed of amorphous silicon (a-Si) or various organic semiconductor materials such as pentacene and the like. The active layer 111 may be formed of an oxide.

The insulating layer 103 may be positioned on the active layer 111. The insulating layer 103 may be formed of an insulating inorganic material such as silicon oxide (SiOx) or silicon nitride (SiNx), and besides, may also be formed of an insulating organic material or the like.

The gate electrode 113 may be positioned on the insulating layer 103. The gate electrode 113 may be formed of various conductive materials, for example, magnesium (Mg), aluminum (Al), nickel (Ni), chromium (Cr), molybdenum (Mo), tungsten (W), gold (Au), or alloys thereof.

The gate insulating layer 104 may be positioned on the gate electrode 113. The gate insulating layer 104 may be formed of an insulating material such as silicon oxide (SiOx) or silicon nitride (SiNx), and besides, may also be formed of an insulating organic material.

By selectively removing the insulating layer 103 and the gate insulating layer 104, contact holes through which source and drain regions are exposed may be formed. The source electrode and the drain electrode 112 may be electrode materials on the gate insulating layer 104 and may be formed in a single layer or multi-layer structure. In one embodiment, an additional passivation layer formed of an inorganic insulating material may be formed to cover the source electrode and the drain electrode 112.

The planarization layer 105 may be disposed on the driving element 110 configured as described above.

The planarization layer 105 may have a multilayer structure composed of at least two layers, and for example, referring to FIG. 2, may include a first planarization layer 105a and a second planarization layer 105b. The first planarization layer 105a may be disposed to cover the driving element 110, and may be disposed such that portions of the source electrode and the drain electrode 112 of the driving element 110 are exposed.

The planarization layer 105 may extend to the non-display area NA to cover the GIP unit 125, as shown in FIG. 3.

The planarization layer 105 may have a thickness in a range of about 1 micrometer (μm) to about 5 μm, such as 1 μm, 2 μm, 3 μm, 4 μm, 5 μm or any thickness therebetween, but is not limited thereto.

The planarization layer 105 may be an overcoat layer, but is not limited thereto.

The planarization layer 105 may be disposed to terminate at a position that is spaced apart from an end of the substrate 101 by a predetermined distance or selected distance, labeled "$D_{PS}$" in FIG. 3, but is not limited thereto.

The connection electrode 114 for electrically connecting the driving element 110 and the organic light emitting element 150 may be disposed on the first planarization layer 105a. In addition, although not shown in FIG. 2, various metallic layers serving as lines/electrodes such as data lines and signal lines may be disposed on the first planarization layer 105a.

The second planarization layer 105b may be disposed on the first planarization layer 105a and the connection electrode 114. The planarization layer 105 according to the first embodiment of the present disclosure may be formed of two planarization layers 105a, 105b due to an increase in the number of various signal lines as the electroluminescent display device has a higher resolution. Therefore, an additional planarization layer 105b is provided to aid routing of lines on one layer while securing a minimum or reduced distance between the lines. The inclusion of such an additional layer (e.g., the second planarization layer 105b) provides a place for line routing, so that line/electrode routing design may be further improved. In one embodiment, a dielectric material is used as the planarization layer 105 including multiple layers, which enables formation of capacitors between metallic layers embedded in the planarization layer 105.

The second planarization layer 105b may be formed such that a portion of the connection electrode 114 is exposed, and the drain electrode 112 of the driving element 110 and the anode of the organic light emitting element 150 may be electrically coupled to each other by the connection electrode 114.

The organic light emitting element 150 may be configured by sequentially disposing an anode 151, a plurality of organic layers 152, and a cathode 153. That is, the organic light emitting element 150 may include the anode 151 that is formed on the planarization layer 105, the organic layer 152 that is formed on the anode 151, and the cathode 153 that is formed on the organic layer 152.

The electroluminescent display device may be implemented in a top emission method or a bottom emission method. In the top emission method, a reflective layer formed of an opaque conductive material with high reflectivity, for example, silver (Ag), aluminum (Al), gold (Au), molybdenum (Mo), tungsten (W), chromium (Cr), or an alloy thereof, may be added under the anode 151, such that light emitted from the organic layer 152 is reflected by the anode 151 and is directed upward, that is, in a direction toward the cathode 153 and away from the substrate 101. In the case of the bottom emission method, the anode 151 may be formed of a transparent conductive material such as indium tin oxide (ITO), indium zinc oxide (IZO), indium gallium zinc oxide (IGZO) or the like. Hereinafter, description is provided in the context of the electroluminescent display device having the bottom emission method configuration. It should be appreciated that the description is similarly applicable to embodiments having the top emission method configuration.

A bank 106 may be formed in areas other than light emitting areas on the planarization layer 105. The bank 106 may have a bank hole that exposes the anode 151. Position of the bank hole corresponds to the light emitting area, shown in FIG. 2. The bank 106 may be formed of an inorganic insulating material such as silicon nitride (SiNx) or silicon oxide (SiOx), or an organic insulating material such as BCB, acrylic resin, or imide resin.

The bank 106 may extend to the non-display area NA, as shown in FIG. 3.

The bank 106 may have a thickness in a range of about 0.1 μm to about 10 μm, such as about 1 μm, 2 μm or 3 μm, but is not limited thereto. It should be appreciated that any value between about 0.1 μm and about 10 μm, such as 4.501 μm or 6.356 μm is included in the range of thickness of the bank 106.

The bank 106 may cover an upper portion of the GIP unit 125, but is not limited thereto. In one embodiment, the bank 106 partially covers an upper surface of the GIP unit 125, and exposes one or more areas of the upper surface, as shown in FIG. 3.

The organic layer 152 may be disposed on the anode 151 that is exposed by the bank 106. The organic layer 152 may include one or more of the light emitting layer, an electron injection layer, an electron transport layer, a hole transport layer, a hole injection layer, or the like.

The organic layer 152 may extend to the non-display area NA, as shown in FIG. 3.

In the non-display area NA, the organic layer 152 may be disposed on the bank 106.

The cathode 153 may be disposed on the organic layer 152.

In the case of the top emission method, the cathode 153 may include a transparent conductive material. For example, the cathode 153 may be formed of indium tin oxide (ITO), indium zinc oxide (IZO), indium gallium zinc oxide (IGZO), or the like. In the case of the bottom emission method, the cathode 153 may include any one of metallic materials such as gold (Au), silver (Ag), aluminum (Al), molybdenum (Mo), magnesium (Mg), palladium (Pd), copper (Cu) or the like, or groups consisting of alloys thereof. Alternatively, the cathode 153 may be configured by stacking a layer formed of a transparent conductive material such as indium tin oxide (ITO), indium zinc oxide (IZO) or indium gallium zinc oxide (IGZO), and a layer formed of a metallic material such as gold (Au), silver (Ag), aluminum (Al), molybdenum (Mo), magnesium (Mg), palladium (Pd), copper (Cu) or the like, or alloys thereof, but is not limited thereto.

The cathode 153 may extend to the non-display area NA, as shown in FIG. 3.

In the non-display area NA, the cathode 153 may be disposed to cover the organic layer 152. In one embodiment, the cathode 153 covers an upper surface of the organic layer 152 and one or more sidewalls of the organic layer 152, as shown in FIG. 3. In one embodiment, the cathode 153 may have an end portion that contacts the bank 106.

The organic layer 152 may be disposed to be spaced apart from an end of the cathode 153 by a predetermined distance or selected distance, labeled "Doc" in FIG. 3, but is not limited thereto.

The cathode 153 may be disposed to be spaced apart from an end of the bank 106 by a predetermined distance or selected distance, labeled "$D_{CB}$" in FIG. 3, but is not limited thereto.

In order to reduce diffused reflection of external light, the capping layer 120 formed of a material having a high refractive index and light absorption may be disposed on the organic light emitting element 150.

The capping layer 120 may be an organic layer formed of an organic material, and may be omitted in some embodiments.

The capping layer 120 may extend to the non-display area NA, as shown in FIG. 3.

In the non-display area NA, the capping layer 120 may be disposed on the cathode 153.

The capping layer 120, the cathode 153 and the organic layer 152 may be referred to collectively as "a plurality of functional layers."

The adhesive layer 130 and the encapsulation substrate 140 may be disposed on the capping layer 120.

The adhesive layer 130 and the encapsulation substrate 140 may extend to the non-display area NA to cover a portion of the planarization layer 105 and the bank 106, as shown in FIG. 3. In one embodiment, the adhesive layer 130 is in contact with the capping layer 120, the bank 106 and the planarization layer 105.

The adhesive layer 130 may be disposed to surround the capping layer 120 and the pixel unit 115. The adhesive layer 130, together with the capping layer 120 and the encapsulation substrate 140, may protect the organic light emitting element 150 of the pixel unit 115 from external moisture, oxygen, impact, and the like. The adhesive layer 130 may further include a moisture absorbent material. The moisture absorbent material may be or include particles having hygroscopicity, and may absorb moisture and oxygen from outside, thereby minimizing or reducing penetration of moisture and oxygen into the pixel unit 115.

The encapsulation substrate 140 may be disposed on the adhesive layer 130. The encapsulation substrate 140 may protect the organic light emitting element 150 of the pixel unit 115 together with the adhesive layer 130. The encapsulation substrate 140 may protect the organic light emitting element 150 from external moisture, oxygen, impact, and the like.

The adhesive layer 130 may be disposed to be spaced apart from an end of the encapsulation substrate 140 by a predetermined distance or selected distance, but is not limited thereto. In one embodiment, the adhesive layer 130 terminates at a location laterally offset from the end of the encapsulation substrate 140 by a distance, labeled "$D_{AE}$" in FIG. 3.

As described above, in the electroluminescent display device, a minimum or reduced bezel distance, that is, a reliable bezel L (see FIG. 3), is beneficial to secure reliability such as moisture penetration prevention.

The reliable bezel L may include a distance measured from the end of the encapsulation substrate 140 to the end of the cathode 153.

In the non-display area NA, an outer area of the display area AA excluding the reliable bezel L may be referred to as the shadow area, which can include the gap between the mask and the substrate 101 when the cathode 153 and the organic layer 152 are deposited.

In one embodiment, the trench patterns 180 are formed in the shadow area and extend through the capping layer 120, the cathode 153, the organic layer 152, the bank and the planarization layer 105.

FIG. 3 illustrates two trench patterns 180 as an example, but the present disclosure is not limited thereto. The trench pattern 180 may include a single trench pattern or a plurality of two or more trench patterns, but the present disclosure is not limited to the number of trench patterns 180.

The trench patterns 180 may be formed by, for example, removing the capping layer 120, the cathode 153, and the organic layer 152 in the shadow area outside the display area AA through laser ablation.

In the case of the planarization layer 105 and the bank 106, the trench patterns 180 may be extended by one or more photolithography processes, but are not limited thereto.

The trench pattern 180 may have a width of about 70 μm when a width of laser is 50 μm, but is not limited thereto. This takes into account a width (e.g., about 20 μm) of an area affected by laser heat.

An inside of the trench pattern 180 may be filled with the adhesive layer 130, but the present disclosure is not limited thereto. A material to be filled in the trench pattern 180 may be any material as long as it can prevent moisture penetration.

A passivation layer 185 for protecting the GIP unit 125 from laser ablation may be disposed on a bottom portion of the trench pattern 180, formed prior to deposition of the organic layer 152, the cathode 153 and the capping layer 120, but is not limited thereto.

The passivation layer 185 may be formed of a transparent conductive material constituting the anode 151 in order to absorb 100% of laser energy when a laser with an ultraviolet spectrum having a wavelength band of about 266 nm is used. The transparent conductive material may include indium tin oxide (ITO), indium zinc oxide (IZO), indium gallium zinc oxide (IGZO) or the like.

As described above, according to the first embodiment of the present disclosure, partial areas of the capping layer 120, the cathode 153, the organic layer 152, the planarization layer 105 and the bank 106 are removed by forming the trench pattern 180 in an inactive shadow area, so that it is possible to delay the rate of moisture penetration to the side surface of the non-display area NA. That is, the bezel width can be reduced by converting the shadow area into an area of the reliable bezel L.

Figure 4:
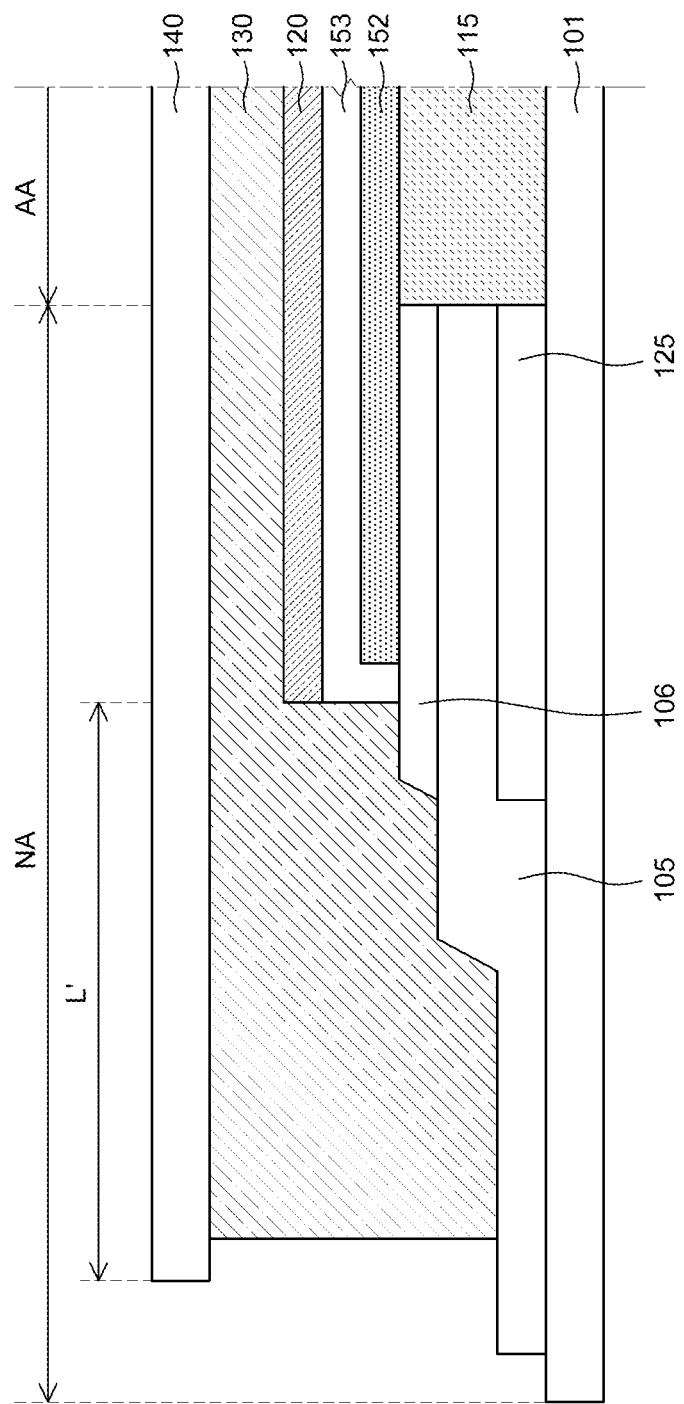
FIG. 4 is a partial cross-sectional view of an electroluminescent display device in accordance with various embodiments.

FIG. 4 is a partial cross-sectional view of an electroluminescent display device according to one or more embodiments.

The electroluminescent display device shown in FIG. 4 has substantially the same configuration as that of the electroluminescent display device according to the first embodiment of the present disclosure of FIG. 3, except that the trench patterns 180 are not present.

Referring to FIG. 4, in the electroluminescent display device according to the comparative example, since the trench patterns 180 according to the first embodiment of the present disclosure are not present, it can be seen that a length of a reliable bezel L' is greater than that of the reliable bezel L in the electroluminescent display device according to the first embodiment of the present disclosure of FIG. 3. By including the trench patterns 180, the reliable bezel L may have reduced length, as shown in FIG. 3, which enables slimming of the non-display area NA.

FIGS. 5A to 5E are cross-sectional views sequentially illustrating parts of a manufacturing process of the electroluminescent display device of FIG. 3.

Figure 5A:
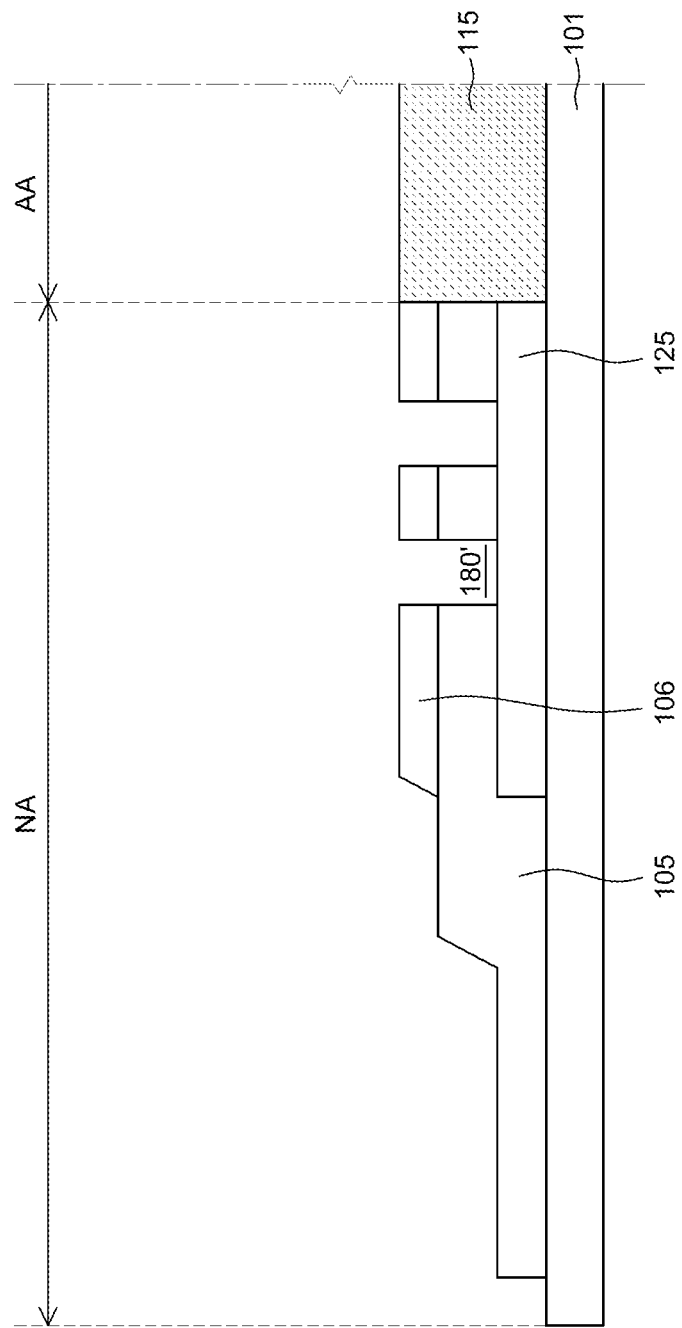
FIGS. 5a to 5e are cross-sectional views of a manufacturing process of the electroluminescent display device of FIG. 3.

Referring to FIG. 5A, various components of the pixel unit 115 are formed on the substrate 101.

As described above, the pixel unit 115 is formed in the display area AA of the substrate 101 and may include various components under the organic layer.

The GIP unit 125 including various components may be formed in the non-display area NA of the substrate 101.

The planarization layer 105 may be formed to extend to the non-display area NA so as to cover the GIP unit 125.

The planarization layer 105 may be formed to be spaced apart from the end of the substrate 101 by a predetermined distance or selected distance (labeled in FIG. 3), but is not limited thereto.

The bank 106 may be formed in an area other than the light emitting area on the planarization layer 105.

The bank 106 may be formed to extend to the non-display area NA.

The bank 106 may cover the upper portion of the GIP unit 125, but is not limited thereto.

The planarization layer 105 and the bank 106 of the non-display area NA outside the display area AA may be selectively removed through predetermined photolithography processes or selected photolithography processes including, for example, a coating process, a soft bake process, an exposure process, a development process, and a curing process, so that primary trench patterns 180' may be formed.

In one embodiment, the primary trench patterns 180' may be formed over three surfaces of the non-display area NA except for the lower end portion of the display panel (see FIG. 1), but is not limited thereto.

The primary trench patterns 180' may serve to block moisture penetration to the side surface of the non-display area NA through the planarization layer 105 and the bank 106 of the non-display area NA.

Figure 5B:
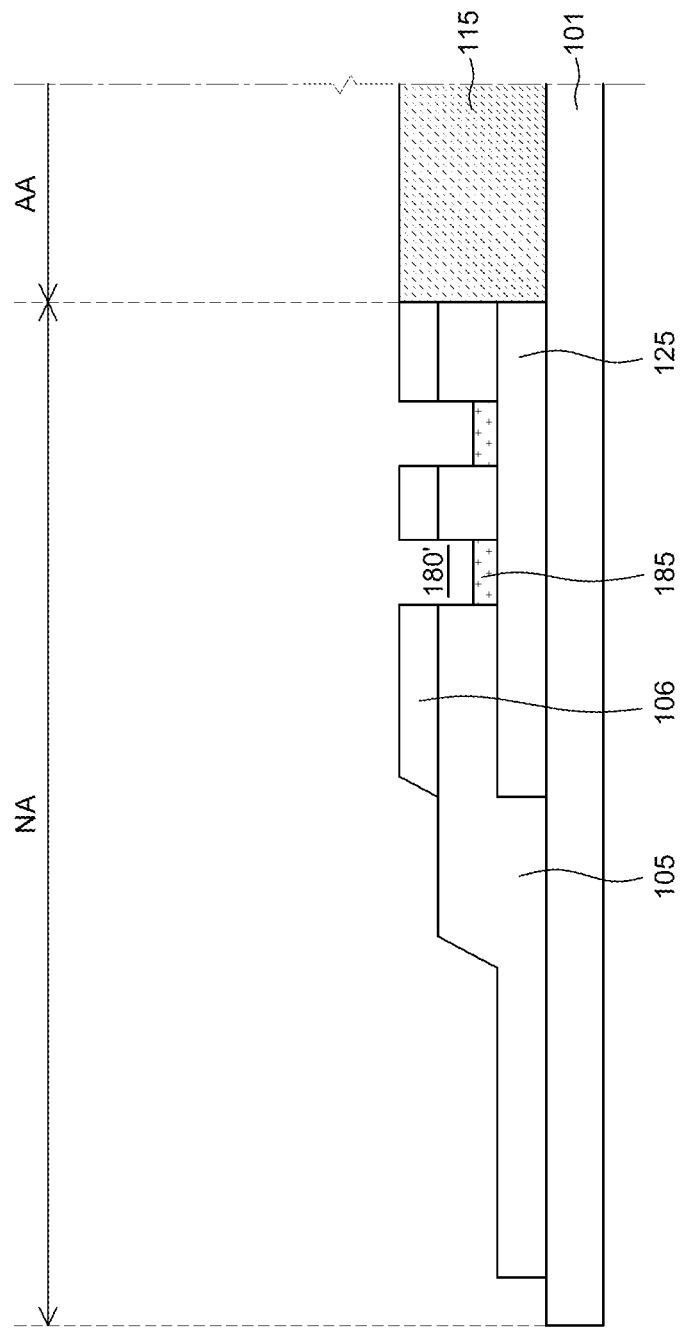

Following formation of the primary trench patterns 180', referring to FIG. 5B, a predetermined passivation layer 185 or selected passivation layer 185 may be formed in a bottom portion of the primary trench pattern 180'. In one embodiment, the passivation layer 185 is formed on portions of the upper surface of the GIP unit 125 exposed by the primary trench patterns 180'.

The passivation layer 185 may be formed of a transparent conductive material in order to absorb 100% of laser when a laser with an ultraviolet area having a wavelength band of about 266 nm is used.

The transparent conductive material may include indium tin oxide (ITO), indium zinc oxide (IZO), or indium gallium zinc oxide (IGZO).

In one embodiment, thickness of the passivation layer 185 is less than that of the planarization layer 105.

FIGS. 5A and 5B illustrate a case in which the passivation layer 185 is formed after the planarization layer 105 and the bank 106 are formed as an example, but the present disclosure is not limited thereto.

In one embodiment, in the case of a transparent conductive material such as ITO, such as is used in forming the anode 151, an absorption rate of ITO in the ultraviolet spectrum is 100%. As such, the passivation layer 185 may be formed in the same process operation as the anode 151, which obviates use of a separate process operation for forming the passivation layer 185. When forming the anode in the pixel unit 115, the passivation layer 185 can be formed on the bottom portion of the primary trench pattern 180'. In one embodiment, when forming the anode in the pixel unit 115, after forming the planarization layer 105 including the primary trench pattern 180', the passivation layer 185 can be formed on the bottom portion of the primary trench pattern 180' in the same process. Thereafter, the bank 106 including the primary trench pattern 180' may be formed on the planarization layer 105.

Figure 5C:
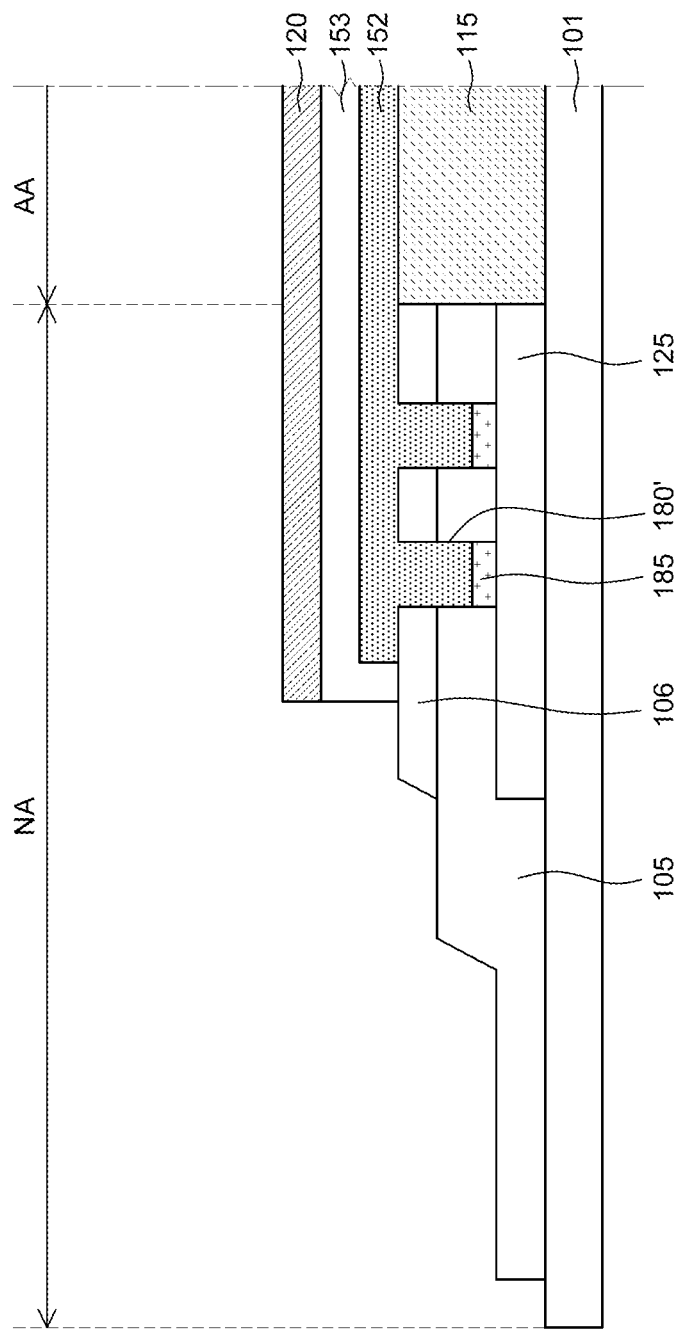

Thereafter, referring to FIG. 5C, the organic layer 152, the cathode 153, and the capping layer 120 may be sequentially formed on the substrate 101 on which the primary trench patterns 180' are formed.

The organic layer 152 may include the light emitting layer, the electron injection layer, the electron transport layer, the hole transport layer, the hole injection layer, and the like.

The organic layer 152 may be formed to extend to the non-display area NA.

In the non-display area NA, the organic layer 152 may be disposed on the bank 106.

An inside of the primary trench pattern 180' may be filled with an organic material constituting the organic layer 152.

The cathode 153 may be disposed on the organic layer 152.

The cathode 153 may be formed to extend to the non-display area NA.

In the non-display area NA, the cathode 153 may be formed to cover the organic layer 152.

The organic layer 152 may be formed to be spaced apart from the end of the cathode 153 by a predetermined distance or selected distance (labeled in FIG. 3), but is not limited thereto.

The cathode 153 may be formed to be spaced apart from the end of the bank 106 by a predetermined distance or selected distance (labeled in FIG. 3), but is not limited thereto.

In order to reduce diffused reflection of external light, the capping layer 120 formed of a material having a high refractive index and light absorption may be formed on the cathode 153.

The capping layer 120 may be an organic layer formed of an organic material, and may be omitted in some embodiments.

The capping layer 120 may be formed to extend to the non-display area NA.

Figure 5D:
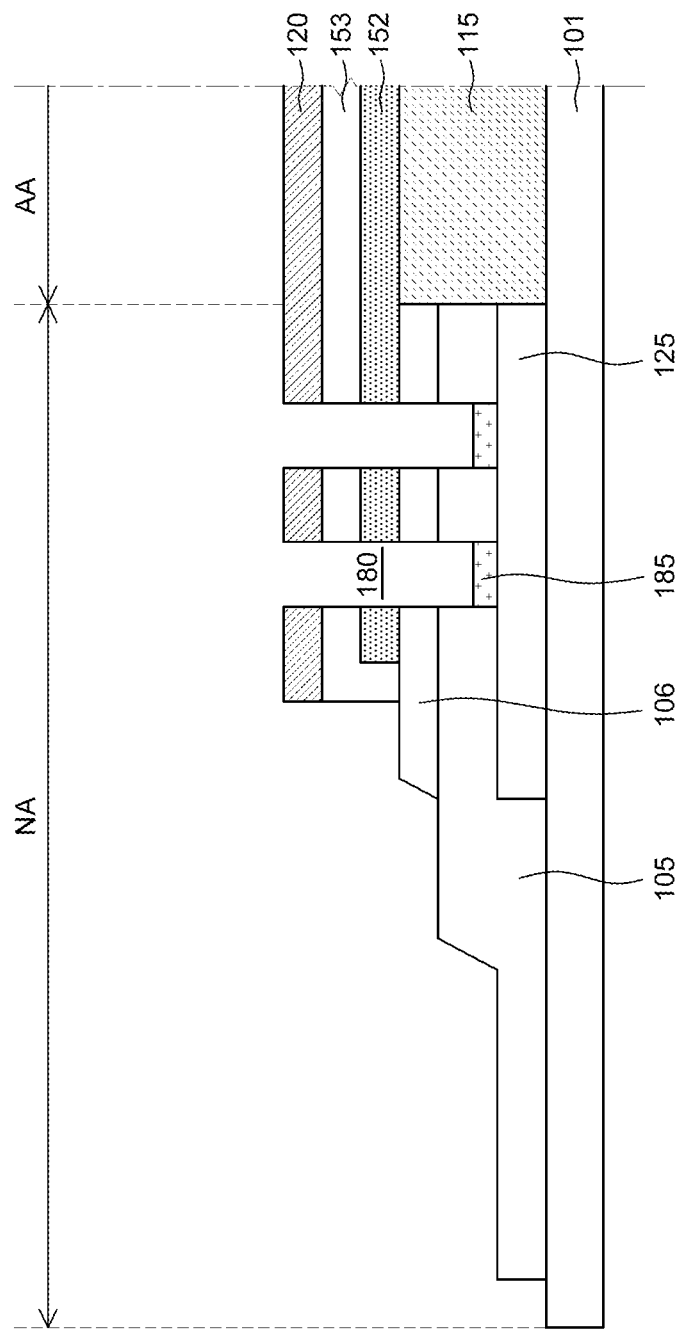

Then, referring to FIG. 5D, partial areas of the capping layer 120, the cathode 153, the organic layer 152, the bank 106, and the planarization layer 105 on the passivation layer 185 are sequentially removed by a laser ablation operation using a predetermined laser or selected laser, so that the trench patterns 180 may be formed. The portion of the trench patterns 180 extending through the capping layer 120, the cathode 153 and the organic layer 152 may be referred to as a "secondary trench pattern."

The trench patterns 180 may serve to block moisture penetration to the side surface of the non-display area NA.

In the first embodiment of the present disclosure, as the trench patterns 180 are also formed in the bank 106 and the planarization layer 105, moisture penetration to the side surface of the non-display area NA through the bank 106 and the planarization layer 105 may be effectively blocked.

As the passivation layer 185 capable of absorbing 100% of the laser is positioned in the bottom portion of the trench pattern 180, the GIP unit 125 disposed therebelow may be protected from laser ablation. As such, laser ablation may continue uninterrupted through a region including the GIP unit 125, enabling a large degree of freedom in the laser ablation process.

Figure 5E:
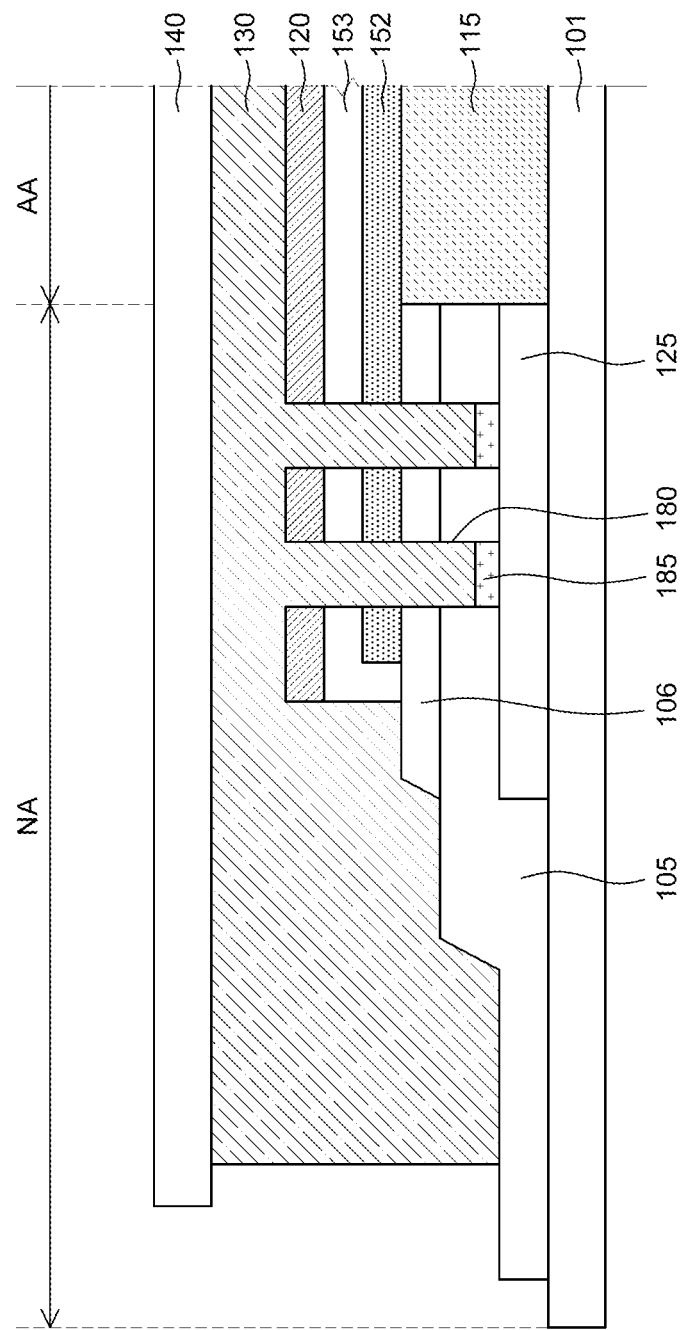

Thereafter, referring to FIG. 5E, the adhesive layer 130 and the encapsulation substrate 140 may be sequentially formed on the substrate 101 on which the capping layer 120 is formed.

The adhesive layer 130 together with the capping layer 120 and the encapsulation substrate 140 may protect the organic light emitting element of the pixel unit 115 from external moisture, oxygen, impact, and the like. The adhesive layer 130 may further include a moisture absorbent material.

The inside of the trench pattern 180 may be filled with an organic material of the adhesive layer 130.

The encapsulation substrate 140 may be disposed on the adhesive layer 130.

The adhesive layer 130 may be formed to be spaced apart from the end of the encapsulation substrate 140 by a predetermined distance or selected distance (labeled in FIG. 3), but is not limited thereto.

In the case of the first embodiment of the present disclosure, as the trench patterns 180 are formed in the shadow area outside the display area AA, it is possible to slow the rate of water penetration to the side surface of the non-display area NA. That is, by converting the shadow area into the reliable bezel area, the bezel width can be reduced by an amount equal to the length of the reliable bezel.

In one embodiment, trench patterns 280 may not extend into the planarization layer 105 and the bank 106, described with reference to FIG. 6 below.

Figure 6:
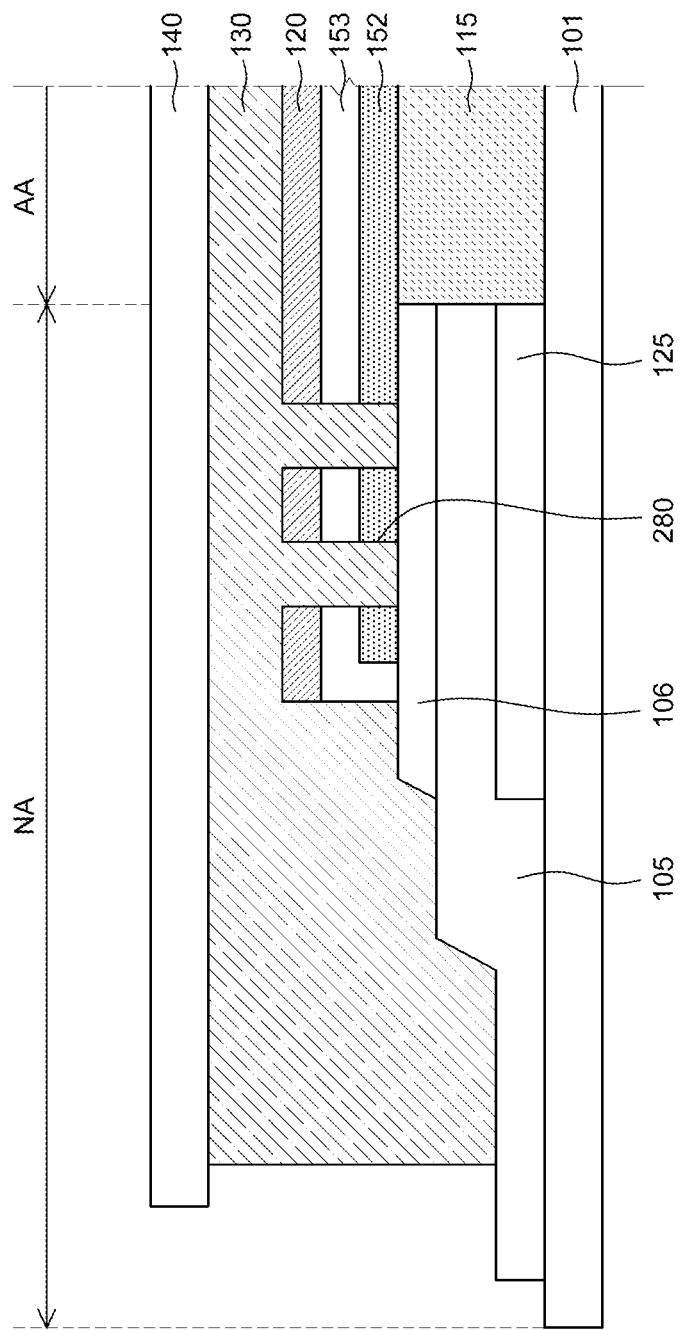
FIG. 6 is a cross-sectional view of an electroluminescent display device according to a second embodiment of the present disclosure.

FIG. 6 is a cross-sectional view of an electroluminescent display device according to a second embodiment of the present disclosure.

In the second embodiment of the present disclosure shown in FIG. 6, configurations of trench patterns 280 differ from those of trench patterns 180 described with reference to FIGS. 1-5E above, and other configurations are substantially the same as those of the electroluminescent display device according to the first embodiment of the present disclosure in FIG. 3. Thus, repeated description will be omitted for brevity. Like reference numerals are used for like components.

Referring to FIG. 6, in the electroluminescent display device according to the second embodiment of the present disclosure, the trench patterns 280 are formed such that areas from the capping layer 120 to the organic layer 152, in the outside of the display area AA, are removed therefrom.

That is, the trench patterns 280 according to the second embodiment of the present disclosure may not be formed in the planarization layer 105 and the bank 106. As such, the GIP unit 125 may be protected from laser ablation by the bank 106 and the planarization layer 105, and the passivation layer 185 is not present.

The trench patterns 280 may be formed by, for example, removing the capping layer 120, the cathode 153, and the organic layer 152 in the shadow area outside the display area AA through laser ablation.

An inside of the trench patterns 280 may be filled with the adhesive layer 130, but the present disclosure is not limited thereto.

In one embodiment, the trench patterns are formed up to the planarization layer below, but the passivation layer may not be formed on the bottom inside the trench pattern, which will be described with reference to FIG. 7 below.

Figure 7:
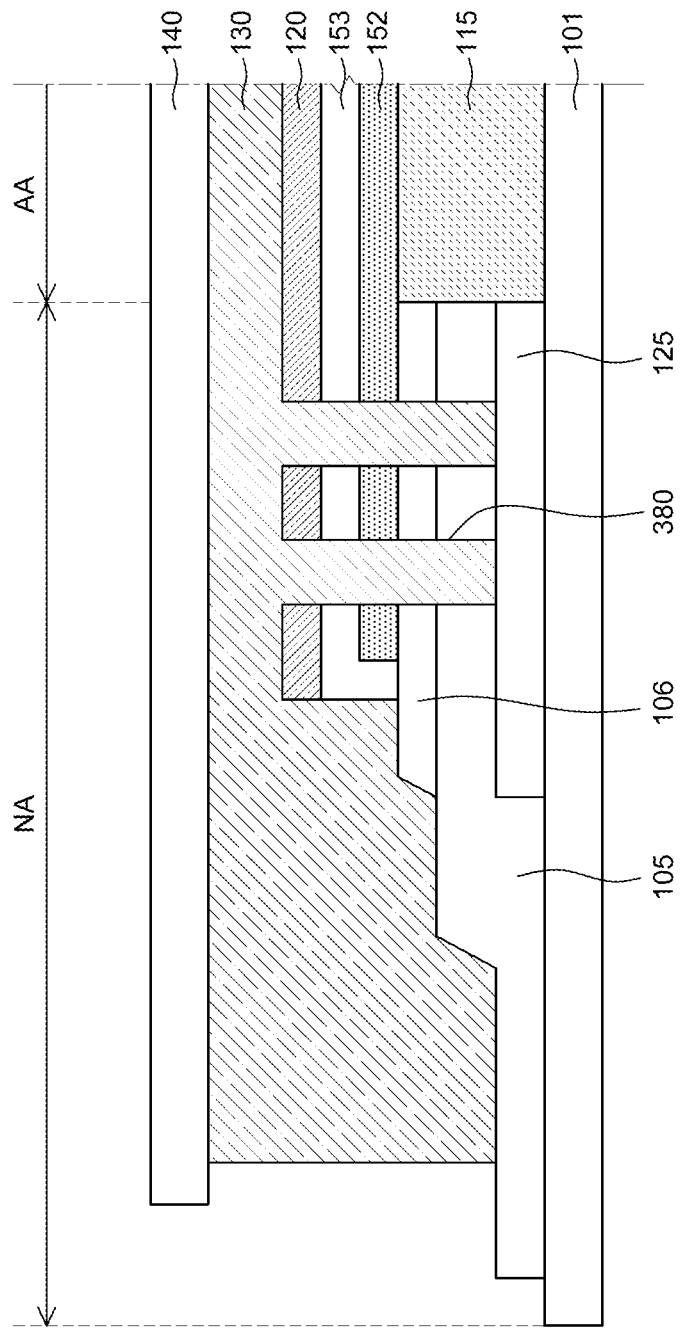
FIG. 7 is a cross-sectional view of an electroluminescent display device according to a third embodiment of the present disclosure.

FIG. 7 is a cross-sectional view of an electroluminescent display device according to a third embodiment of the present disclosure.

In the third embodiment of the present disclosure of FIG. 7, configurations of trench patterns 380 differ from those described with reference to FIGS. 1-6, and other configurations are substantially the same as those of the electroluminescent display device shown in FIG. 6. Thus, repeated description will be omitted for brevity. Like reference numerals are used for like components.

Referring to FIG. 7, the electroluminescent display device according to the third embodiment of the present disclosure includes trench patterns 380 extend through the capping layer 120 into the planarization layer 105, in the area outside the display area AA.

The passivation layer 185 is not formed on the bottom portion of the trench pattern 380. In this case, pathing of the laser during the laser ablation operation may be modified to avoid passing over the GIP unit 125.

An inside of the trench pattern 380 may be filled with the adhesive layer 130, but the present disclosure is not limited thereto.

According to the present disclosure, an inorganic layer may be additionally formed on the capping layer, which will be described with reference to FIG. 8 below.

Figure 8:
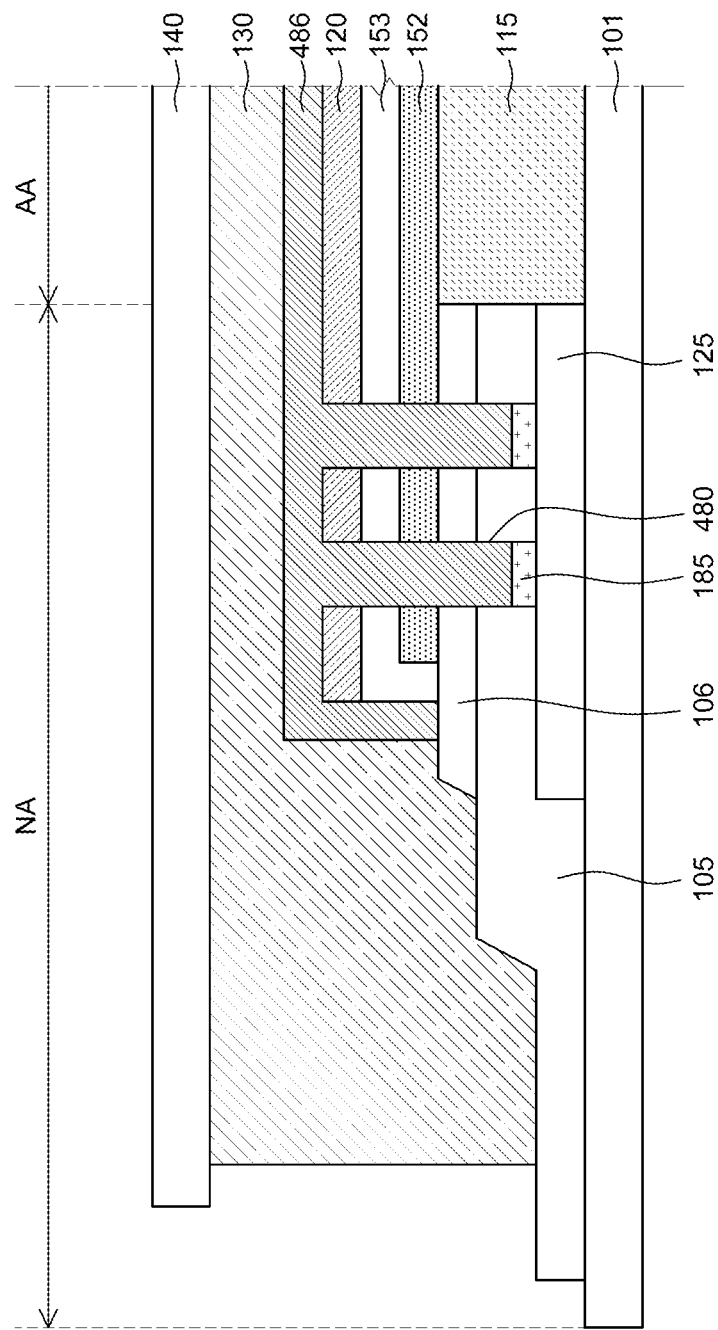
FIG. 8 is a cross-sectional view of an electroluminescent display device according to a fourth embodiment of the present disclosure.

FIG. 8 is a cross-sectional view of an electroluminescent display device according to a fourth embodiment of the present disclosure.

In the fourth embodiment of the present disclosure shown in FIG. 8, configurations of trench patterns 480 and an inorganic layer 486 differ from those described with reference to FIGS. 1-7, and other configurations are substantially the same as described with reference to the first embodiment of the present disclosure of FIG. 2. Thus, repeat description will be omitted for brevity. Like reference numerals are used for like components.

Referring to FIG. 8, the electroluminescent display device according to the fourth embodiment of the present disclosure includes the trench patterns 480 formed extending through the capping layer 120 and into the planarization layer 105 below, in the outside of the display area AA.

The passivation layer 185 may be disposed on a bottom portion of the trench pattern 480, but is not limited thereto.

The inorganic layer 486 formed of an inorganic insulating material may be disposed on the capping layer 120. The inorganic layer 486 may be formed of silicon oxide (SiOx), silicon nitride (SiNx), or a multilayer thereof.

The inorganic layer 486 may be formed to cover the upper portion of the capping layer 120 and side surfaces of the capping layer 120, the cathode 153, and the organic layer 152.

An inside of the trench pattern 480 may be filled with the inorganic layer 486, but the present disclosure is not limited thereto.

In the fourth embodiment of the present disclosure, by forming the inorganic layer 486 on the capping layer 120, moisture penetration in an upper portion of the organic layer 152 can be slowed, and defects caused by dents or foreign substances can be reduced.

In one embodiment, the trench pattern of the present disclosure may be divided into a plurality of patterns other than a continuous single pattern, which will be described with reference to FIG. 9 below.

Figure 9:
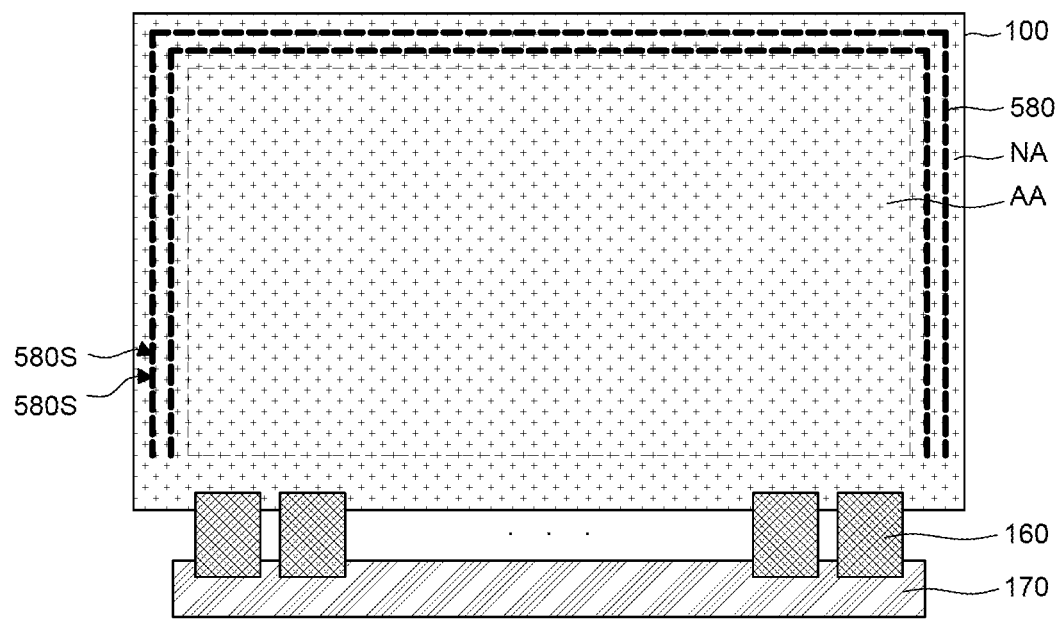
FIG. 9 is a plan view of an electroluminescent display device according to a fifth embodiment of the present disclosure.

FIG. 9 is a plan view of an electroluminescent display device according to a fifth embodiment of the present disclosure.

In the fifth embodiment of the present disclosure shown in FIG. 9, configurations of trench patterns 580 differ from those described with reference to FIGS. 1-8, and other configurations are substantially the same as those of the electroluminescent display device according to the first embodiment of the present disclosure in FIG. 1. Thus, repeat description will be omitted for brevity. Like reference numerals are used for like components.

Referring to FIG. 9, the electroluminescent display device according to the fifth embodiment of the present disclosure may include the display panel 100, the flexible films 160, and the printed circuit boards 170.

In the fifth embodiment of the present disclosure, the trench pattern 580 is formed in a portion of the non-display area NA outside the display area AA.

The trench pattern 580 may be formed such that an area from the capping layer 120 to the planarization layer 105 is removed therefrom, but is not limited thereto.

The trench pattern 580 according to the fifth embodiment of the present disclosure may be formed over three surfaces of the non-display area NA except for the lower end portion of the display panel 100 to which the flexible films 160 are coupled, but the present disclosure is not limited thereto.

In FIG. 9, a case in which the trench pattern 580 is divided into plural numbers to form two columns is illustrated as an example, but the present disclosure is not limited thereto. The trench pattern 580 may be divided into plural numbers to form one column or a plurality of two or more columns, but the present disclosure is not limited to the number of columns of the trench patterns 580.

Meanwhile, the trench pattern of the present disclosure may be provided in a plurality of three or more trench patterns, which will be described with reference to FIGS. 10 and 11 below.

In one embodiment, formation of the trenches 580 includes one or more laser ablation operations. In each laser ablation operation, the laser may be pulsed as the laser travels along the path of each trench 580, such that two or more trench segments 580S are formed.

Figure 10:
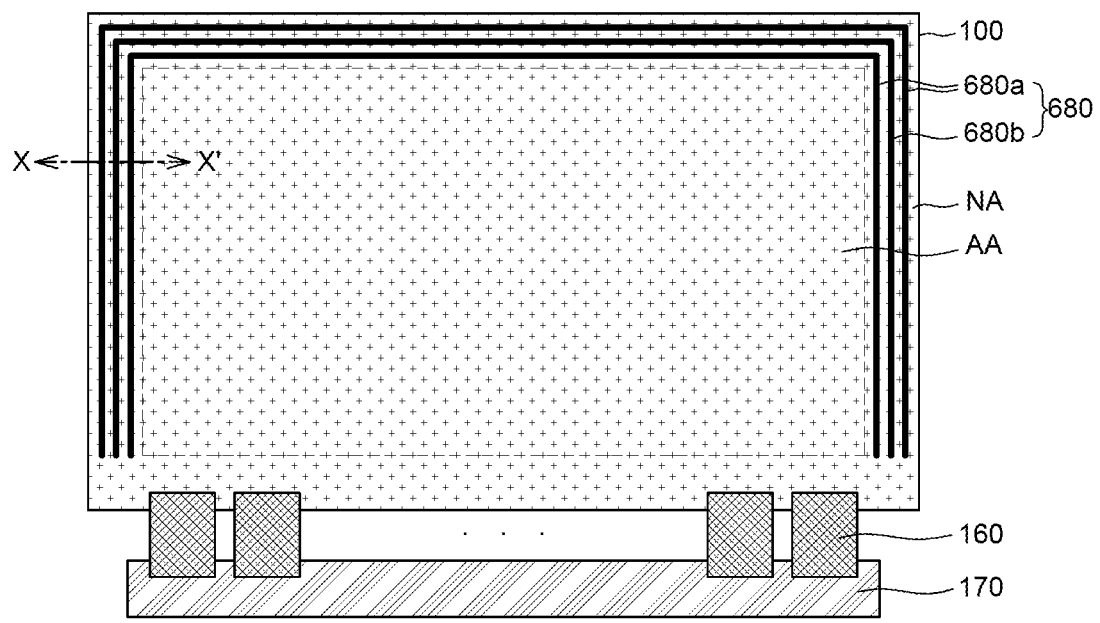
FIG. 10 is a plan view of an electroluminescent display device according to a sixth embodiment of the present disclosure.

FIG. 10 is a plan view of an electroluminescent display device according to a sixth embodiment of the present disclosure.

Figure 11:
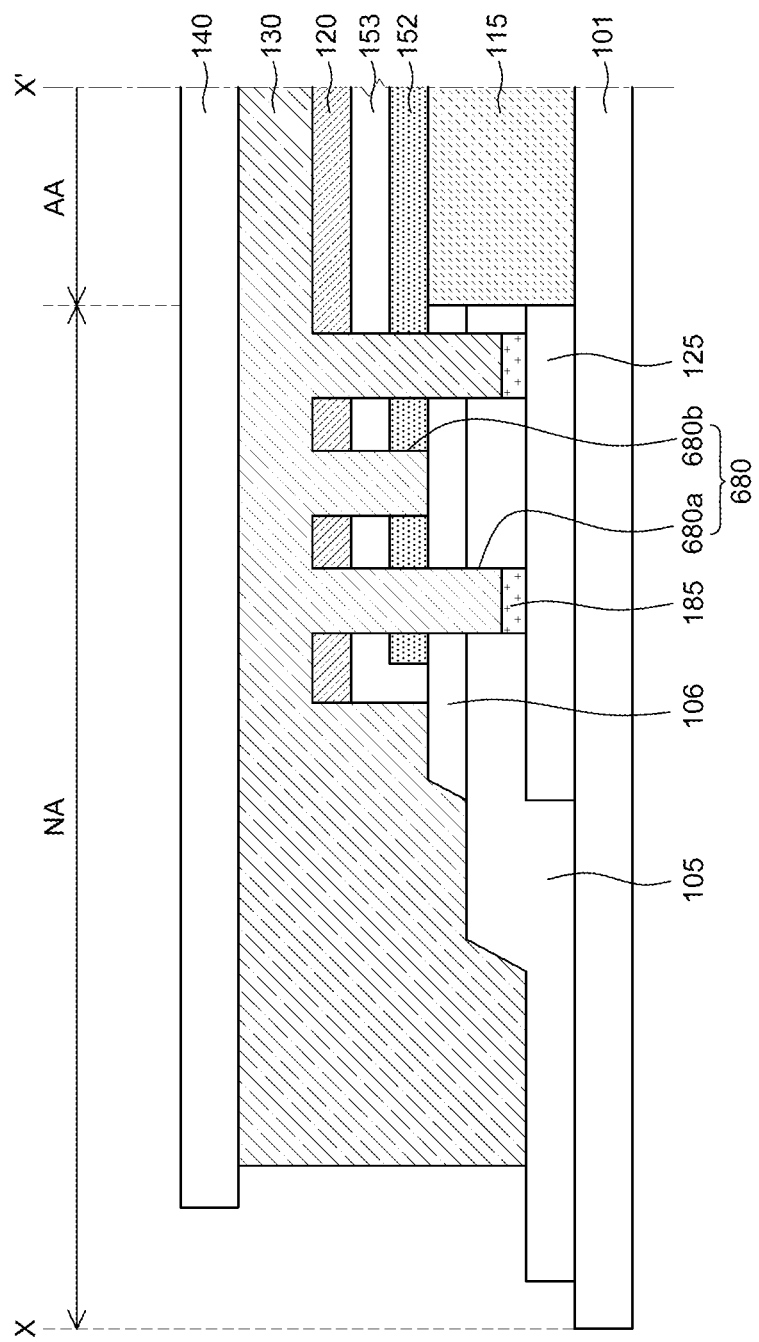
FIG. 11 is a cross-sectional view taken along line X-X' of FIG. 10.

FIG. 11 is a cross-sectional view taken along line X-X' of FIG. 10.

FIG. 11 illustrates, for example, a cross-section of a portion of a right side of the display panel 100 in which trench patterns 680 are formed.

In the sixth embodiment of the present disclosure shown in FIGS. 10 and 11, configurations of the trench patterns 680 differ from previous description, and other configurations are substantially the same as those of the electroluminescent display device according to the first embodiment of the present disclosure described with reference to FIGS. 1 to 3. Thus, repeat descriptions will be omitted for brevity. Like reference numerals are used for like components.

Referring to FIGS. 10 and 11, the electroluminescent display device according to the sixth embodiment of the present disclosure may include the display panel 100, the flexible films 160, and the printed circuit board 170.

In the sixth embodiment of the present disclosure, the trench pattern 680 is formed in a portion of the non-display area NA outside the display area AA.

The trench pattern 680 according to the sixth embodiment of the present disclosure may be formed over three surfaces of the non-display area NA except for the lower end portion of the display panel 100 to which the flexible films 160 are coupled, but is limited thereto.

In FIG. 10, a case in which three trench patterns 680 are provided is illustrated as an example, but the present disclosure is not limited thereto.

The trench pattern 680 according to the sixth embodiment of the present disclosure may include at least one first trench pattern 680a from which an area from the capping layer 120 to the planarization layer 105 below is removed, and at least one second trench pattern 680b from which an area from the capping layer 120 to the organic layer 152 is removed, but the present disclosure is not limited thereto. In one embodiment, the second trench pattern 680b lands on the bank 106. In one embodiment, the first trench patterns 680a land on the GIP unit 125.

FIGS. 10 and 11 illustrate a case in which two first trench patterns 680a are provided and one second trench pattern 680b is provided between the two first trench patterns 680a as an example, but the present disclosure is not limited thereto. In this case, the passivation layer 185 may be additionally disposed on a bottom portion of the first trench pattern 680a, but is not limited thereto.

The first trench pattern 680a and the second trench pattern 680b may be disposed in alternating fashion.

The second trench pattern 680b may be disposed between the first trench patterns 680a. In one embodiment, two or more second trench patterns 680b are disposed between a neighboring pair of first trench patterns 680a.

In addition, as long as the first trench pattern 680a and the second trench pattern 680b according to the sixth embodiment of the present disclosure have different shapes, they can be configured by applying various forms of the first embodiment to the fifth embodiment of the present disclosure described above, thereto.

Insides of the first trench pattern 680a and the second trench pattern 680b may be filled with the adhesive layer 130, but the present disclosure is not limited thereto.

The embodiments of the present disclosure can also be described as follows:

According to an embodiment of the present disclosure, there is provided an electroluminescent display device. The electroluminescent display device includes a display panel having a display area and a non-display area, a planarization layer and a bank which extend to a non-display area of the display panel, an organic layer and a cathode which are disposed on the bank and extend to the non-display area of the display panel, a trench pattern which is disposed in the non-display area outside the display area and in which the cathode and the organic layer are removed and an adhesive layer and an encapsulation substrate which are disposed over the cathode, wherein the adhesive layer covers the trench pattern.

The trench pattern may be disposed over three surfaces of the non-display area except for a lower end portion of the display panel to which a flexible film may be coupled.

The electroluminescent display device may further include a capping layer disposed on the cathode, wherein the capping layer, the cathode, and the organic layer may be removed in the trench pattern.

The electroluminescent display device may further include a gate-in-panel (GIP) unit disposed in the non-display area, wherein the planarization layer may extend to the non-display area to cover the GIP unit.

The bank may be disposed in a remainder area other than a light emitting area on the planarization layer, and may extend to the non-display area to cover an upper portion of the GIP unit.

The adhesive layer and the encapsulation substrate may extend to the non-display area to cover a portion of the planarization layer and the bank.

The trench pattern may be provided as one trench pattern or a plurality of two or more trench patterns.

The capping layer, the cathode, the organic layer, the bank, and the planarization layer may be removed in the trench pattern.

The trench pattern may be disposed over the GIP unit, wherein a passivation layer may be disposed on a bottom inside the trench pattern.

The passivation layer may be made of a transparent conductive material constituting an anode of the display area.

The transparent conductive material may include indium tin oxide (ITO), indium zinc oxide (IZO), or indium gallium zinc oxide (IGZO).

An inside of the trench pattern may be filled with the adhesive layer.

The electroluminescent display device may further include an inorganic layer disposed on the capping layer, wherein an inside of the trench pattern may be filled with the inorganic layer.

The inorganic layer may be made of silicon oxide (SiOx), silicon nitride (SiNx), or a multilayer thereof.

The inorganic layer may be disposed to cover an upper portion of the capping layer and side surfaces of the capping layer, the cathode, and the organic layer.

The trench pattern may be separated into a plurality of trench patterns.

The trench pattern may include at least one first trench pattern in which an area from the capping layer to the planarization layer downwardly may be removed and at least one second trench pattern in which an area from the capping layer to the organic layer downwardly may be removed.

The first trench pattern and the second trench pattern may be alternately disposed.

The second trench pattern may be disposed between the first trench patterns.

According to another embodiment of the present disclosure, there is provided an electroluminescent display device. The electroluminescent display device includes a substrate which has a display area and a non-display area, a planarization layer which is disposed on the substrate, a bank which is disposed over the planarization layer, an organic layer, a cathode, and a capping layer which are disposed on the bank and extend to the non-display area of the substrate, at least one trench pattern which is disposed in the non-display area outside the display area and in which the capping layer, the cathode, the organic layer, the bank, and the planarization layer are removed, a passivation layer which is disposed on a bottom inside the trench pattern, an adhesive layer which fills an inside of the trench pattern and is disposed over the substrate and an encapsulation substrate which is disposed on the adhesive layer.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
    a display panel including a display area and a non-display area;
    a planarization layer over the non-display area;
    a bank on the planarization layer;
    an organic layer on the bank;
    a cathode on the bank and extending to the non-display area of the display panel;
    a trench pattern disposed in the non-display area and in a location where the cathode and the organic layer are removed;
    a capping layer disposed on the cathode, the trench pattern extending through the capping layer;
    an adhesive layer over the cathode and the trench pattern; and
    an encapsulation substrate over the cathode and the adhesive layer,
    wherein an end portion of the cathode outside the trench pattern covers a vertical end portion of the organic layer.

2. The electroluminescent display device of claim 1,
    wherein the display panel includes a plurality of end portions, one of the plurality of end portions having a flexible film connected thereto and being substantially free of the trench pattern;
    wherein the trench pattern is disposed over others of the plurality of end portions.

3. The electroluminescent display device of claim 1, wherein the trench pattern extends through the bank and the planarization layer.

4. The electroluminescent display device of claim 1, further comprising:
    an inorganic layer disposed on the capping layer, wherein the trench pattern is filled with the inorganic layer.

5. The electroluminescent display device of claim 4, wherein the inorganic layer is made of silicon oxide, silicon nitride, or a multilayer thereof.

6. The electroluminescent display device of claim 4, wherein the inorganic layer is disposed to cover an upper portion of the capping layer and side surfaces of the capping layer, the cathode, and the organic layer.

7. The electroluminescent display device of claim 1, wherein the trench pattern includes:
    at least one first trench pattern extending through the planarization layer; and
    at least one second trench pattern landing on the bank.

8. The electroluminescent display device of claim 7, wherein the second trench pattern is disposed between a pair of the first trench patterns that neighbor each other.

9. The electroluminescent display device of claim 1, further comprising:
    a gate-in-panel (GIP) unit disposed in the non-display area, the planarization layer extending to the non-display area to cover the GIP unit.

10. The electroluminescent display device of claim 9, wherein the bank has an opening that exposes a light emitting area, and covers an upper portion of the GIP unit.

11. The electroluminescent display device of claim 9, wherein the trench pattern is disposed over the GIP unit, wherein a passivation layer is disposed in a bottom portion of the trench pattern.

12. The electroluminescent display device of claim 11, wherein the passivation layer includes a transparent conductive material, the transparent conductive material having substantially the same composition as that of an anode of the display area.

13. The electroluminescent display device of claim 12, wherein the transparent conductive material includes indium tin oxide, indium zinc oxide, or indium gallium zinc oxide.

14. The electroluminescent display device of claim 1, wherein the adhesive layer and the encapsulation substrate cover a portion of the planarization layer and the bank.

15. The electroluminescent display device of claim 1, wherein the trench pattern includes two or more trench segments.

16. The electroluminescent display device of claim 1, wherein the trench pattern is filled with the adhesive layer.

17. An electroluminescent display device, comprising:
    a substrate including a display area and a non-display area;
    a planarization layer disposed on the substrate;
    a bank disposed over the planarization layer;
    a plurality of functional layers disposed on the bank on the non-display area of the substrate;
    at least one trench pattern in the non-display area, the at least one trench pattern extending through the plurality of functional layers, the bank and the planarization layer;
    a gate-in-panel (GIP) unit disposed in the non-display area, the planarization layer extending to the non-display area to cover the GIP unit, wherein a portion of the at least one trench pattern overlaps with the GIP unit;
    a passivation layer disposed in the trench pattern;
    an adhesive layer on the passivation layer, the adhesive layer filling the trench pattern; and
    an encapsulation substrate disposed on the adhesive layer.

18. A method, comprising:
    forming a planarization layer on a non-display area of a substrate;
    forming a bank on the planarization layer;
    forming a plurality of functional layers on the bank;
    forming a trench extending through the plurality of functional layers;
    forming a gate-in-panel (GIP) unit disposed in the non-display area, the planarization layer extending to the non-display area to cover the GIP unit, wherein a portion of the at least one trench overlaps with the GIP unit;

depositing an adhesive layer into the trench; and attaching an encapsulation substrate to the adhesive layer over the trench.

19. The method of claim 18, wherein the forming a trench includes:

forming a primary trench pattern of the trench through the bank and the planarization layer by at least one photolithography operation; and forming a secondary trench pattern of the trench through the plurality of functional layers by at least one laser ablation operation.

* * * * *